(12) United States Patent
Yan et al.

(10) Patent No.: US 9,786,842 B1
(45) Date of Patent: Oct. 10, 2017

(54) MEMORY CELL WITH FUNCTIONS OF STORAGE ELEMENT AND SELECTOR

(71) Applicant: OPTO TECH CORPORATION, Hsinchu (TW)

(72) Inventors: Ming-Yi Yan, Taoyuan (TW); Jhih-You Lu, New Taipei (TW); Hsien-Chih Huang, Hsinchu (TW); Yun-Shiuan Li, Taipei (TW); Jiun-Yun Li, Taipei (TW); I-Chun Cheng, Taipei (TW); Chih-Ming Lai, New Taipei (TW); Yue-Lin Huang, Kaohsiung (TW); Lung-Han Peng, Taipei (TW)

(73) Assignee: OPTO TECH CORPORATION, Hsinchu (TW)

( * ) Notice: Subject to any disclaimer, the term of this patent is extended or adjusted under 35 U.S.C. 154(b) by 0 days.

(21) Appl. No.: 15/281,852

(22) Filed: Sep. 30, 2016

(30) Foreign Application Priority Data

May 9, 2016 (TW) .................................. 105114324

(51) Int. Cl.
*H01L 45/00* (2006.01)
*G11C 13/00* (2006.01)
(52) U.S. Cl.
CPC .......... *H01L 45/06* (2013.01); *G11C 13/0004* (2013.01); *G11C 13/0007* (2013.01);
(Continued)
(58) Field of Classification Search
CPC . H01L 45/06; H01L 45/1233; H01L 45/1253; H01L 45/146; H01L 45/12; G11C 13/0069; G11C 13/0004; G11C 13/0007
See application file for complete search history.

(56) References Cited

U.S. PATENT DOCUMENTS

| 2004/0245544 A1* | 12/2004 | Fricke | ................... | H01L 27/101 257/104 |
| 2005/0024933 A1* | 2/2005 | Pellizzer | ............. | H01L 27/2445 365/163 |

(Continued)

FOREIGN PATENT DOCUMENTS

TW 201133867 10/2011

OTHER PUBLICATIONS

Taiwan Intellectual Property Office, Office Action dated Dec. 5, 2016.

(Continued)

*Primary Examiner* — Caridad Everhart
(74) *Attorney, Agent, or Firm* — WPAT, PC

(57) ABSTRACT

A single memory cell has the functions of a storage element and a selector. The memory cell includes a P-type layer, a tunneling structure and an N-type layer. The tunneling structure is formed on the P-type layer. The N-type layer is formed on the tunneling structure. The tunneling structure is a stack structure including a first material layer, a second material layer and a third material layer. By adjusting a bias voltage that is applied to the P-type layer and the N-type layer, the tunneling structure is controlled to be in the amorphous state or the crystalline state. Consequently, the memory cell has the memorizing and storing functions. The memory cell has the P-type layer, the tunneling structure and the N-type layer. By adjusting the bias voltage, the function of the selector is achieved.

12 Claims, 9 Drawing Sheets

(52) U.S. Cl.
CPC ...... *G11C 13/0069* (2013.01); *G11C 13/0097* (2013.01); *H01L 45/12* (2013.01); *H01L 45/1233* (2013.01); *H01L 45/1253* (2013.01); *H01L 45/146* (2013.01)

(56) References Cited

U.S. PATENT DOCUMENTS

| | | | | |
|---|---|---|---|---|
| 2006/0091373 | A1* | 5/2006 | Lee ................ | G11C 11/5678 257/2 |
| 2009/0250679 | A1* | 10/2009 | Jung ................ | H01L 27/2409 257/2 |
| 2010/0163821 | A1* | 7/2010 | Ohashi ............. | G11C 13/0007 257/2 |
| 2011/0248233 | A1* | 10/2011 | Pellizzer .......... | H01L 27/2445 257/1 |
| 2013/0292634 | A1* | 11/2013 | Chen ................ | H01L 27/249 257/5 |

OTHER PUBLICATIONS

Burr, Geoffrey W. et al. "Phase change memory technology" Journal of Vacuum Science & Technology B, vol. 28, Issue 2, p. 223-262 (2010), DOI:http://dx.doi.org/10.1116/1.3301579.

Burr, Geoffrey W. et al. "Access devices for 3D crosspoint memory" Journal of Vacuum Science & Technology B, vol. 32, Issue 4, 040802 (2014), DOI:http://dx.doi.org/10.1116/1.4889999.

Choi, Byung Joon et al. "Trilayer Tunnel Selectors for Memristor Memory Cells" Advanced Materials. vol. 28, Issue 2, p. 356-362, (2016), DOI: 10.1002/adma.201503604.

Akihito Sawa, "Resistive switching in transition metal oxides" Materials Today, vol. 11, Issue 6, Jun. 2008, p. 28-36, ISSN 1369-7021, http://dx.doi.org/10.1016/S1369-7021(08)70119-6.

\* cited by examiner

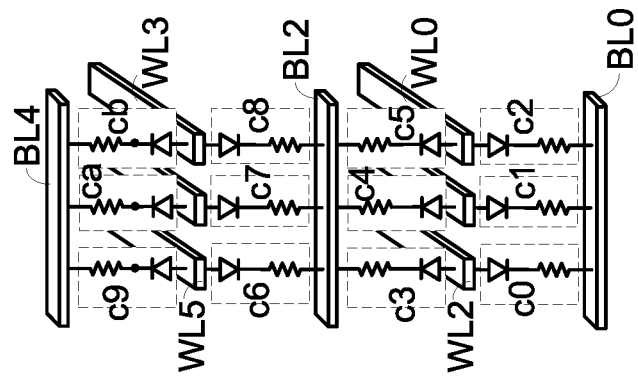
FIG. 1A (PRIOR ART)
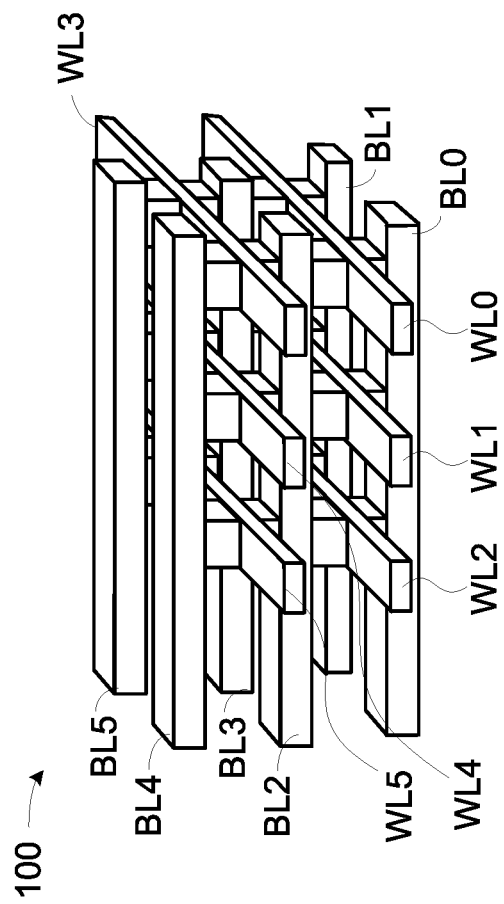
FIG. 1B (PRIOR ART)
FIG. 1C (PRIOR ART)

ΔEc1(Al$_2$O$_3$-Si)=2.44eV   ΔEv1(Al$_2$O$_3$-Si)=3.24eV
ΔEc2(ZnO-Al$_2$O$_3$)=3eV   ΔEv2(ZnO-Al$_2$O$_3$)=0.43eV
ΔEc3(HfO$_2$-ZnO)=2.11eV   ΔEv3(HfO$_2$-ZnO)=0.24eV
ΔEc4(ITO-HfO$_2$)=1.72eV   ΔEv4(ITO-HfO$_2$)=0.28eV

MEMORY CELL WITH FUNCTIONS OF STORAGE ELEMENT AND SELECTOR

This application claims the benefit of Taiwan Patent Application No. 105114324, filed May 9, 2016, the subject matter of which is incorporated herein by reference.

FIELD OF THE INVENTION

The present invention relates to a memory cell, and more particularly to memory cell having a single electronic component with functions of a phase change storage element and a selector.

BACKGROUND OF THE INVENTION

A phase change memory is a non-volatile memory with high operating speed, simple structure and high reliability. Consequently, the phase change memory is gradually favored by users. Moreover, with increasing development of the semiconductor technologies, a three-dimensional (3D) phase change memory is introduced into the market.

Generally, the material of the phase change memory is in a crystalline state or an amorphous state. In case that the material of the phase change memory is in the crystalline state, the resistance is lower. In case that the material of the phase change memory is in the amorphous state, the resistance is higher. That is, the storage state of the phase change memory is determined according to the resistance of the material of the phase change memory.

FIG. 1A schematically illustrates a memory cell of a conventional 3D phase change memory. FIG. 1B is a schematic perspective view of the conventional 3D phase change memory. FIG. 1C is a schematic circuit diagram illustrating an equivalent circuit of the conventional 3D phase change memory.

As shown in FIG. 1A, the memory cell 110 comprises a storage element 102 and a selector 104. The storage element 102 is a phase change element. Moreover, the storage element 102 can be considered as a resistor with variable resistance. The storage element 102 is programmed to have high resistance or low resistance. The high resistance and the low resistance indicate different storage states. The selector 104 is a diode. Moreover, the storage element 102 and the selector 104 are connected with each other in series.

As shown in FIG. 1B, the phase change memory 100 comprises plural word lines WL0~WL5, plural bit lines BL0~BL5 and plural memory cells. The bit lines BL0~BL5 are metal lines along a first direction. The word lines WL0~WL5 are metal lines along a second direction. The first direction and the second direction are perpendicular to each other. Moreover, each memory cell is connected between the corresponding word line and the corresponding bit line.

For example, the memory cells c0~cb are connected between the word lines WL0~WL5 and the bit lines BL0, BL2 and BL4. Please refer to FIG. 1C. The memory cell c0 is connected between the bit line BL0 and the word line WL2. The memory cell c1 is connected between the bit line BL0 and the word line WL1. The memory cell c2 is connected between the bit line BL0 and the word line WL0. The memory cell c3 is connected between the bit line BL2 and the word line WL2. The memory cell c4 is connected between the bit line BL2 and the word line WL1. The memory cell c5 is connected between the bit line BL2 and the word line WL0.

Similarly, the memory cell c6 is connected between the bit line BL2 and the word line WL5. The memory cell c7 is connected between the bit line BL2 and the word line WL4. The memory cell c8 is connected between the bit line BL2 and the word line WL3. The memory cell c9 is connected between the bit line BL4 and the word line WL5. The memory cell ca is connected between the bit line BL4 and the word line WL4. The memory cell cb is connected between the bit line BL4 and the word line WL3.

By controlling the voltages of the bit lines BL0~BL5 and the word lines WL0~WL5, the corresponding memory cell is programmed or read.

The structure of the phase change memory 100 can be further applied to a resistive memory. For increasing the production yield and the reliability of the memory, it is important to search for the better materials of the storage element and the selector.

FIG. 2 is a schematic circuit diagram of a memory cell of the phase change memory. The memory cell is disclosed in Advanced Materials 2016, 28, 356-362, and the contents of which are hereby incorporated by reference. As shown in FIG. 2, the memory cell 210 comprises a storage element 202 and a selector 204. The storage element 202 and the selector 204 are connected with each other in series. The storage element 202 comprises a platinum (Pt) metal layer, a tantalum (Ta) metal layer, and a tantalum oxide ($TaO_x$) between the platinum (Pt) metal layer and the tantalum (Ta) metal layer. The selector 204 comprises two platinum (Pt) metal layers, two tantalum nitride ($TaN_{1+x}$) layers between the two platinum (Pt) metal layers, and a tantalum oxide ($Ta_2O_5$) layer between the two tantalum nitride ($TaN_{1+x}$) layers.

Moreover, by setting or resetting the storage element 202, the resistance of the storage element 202 is adjustable. Moreover, the selector 204 has the characteristics of a diode.

From the above discussions, the memory cell of the conventional phase change memory is composed of two electronic components that are connected with each other in series.

SUMMARY OF THE INVENTION

An object of the present invention provides a novel memory cell of a phase change memory. The memory cell is a single electronic component with the functions of a storage element and a selector.

An embodiment of the present invention provides a memory cell of a phase change memory. The memory cell includes a P-type layer, a tunneling structure and an N-type layer. The tunneling structure is formed on the P-type layer. The tunneling structure is a stack structure including a first material layer, a second material layer and a third material layer. The N-type layer is formed on the tunneling structure. By adjusting a bias voltage that is applied to the P-type layer and the N-type layer, the tunneling structure is controlled to be in the amorphous state or the crystalline state.

Another embodiment of the present invention provides a memory cell of a phase change memory. The memory cell includes a P-type layer, a tunneling structure and an N-type layer. The tunneling structure is formed on the P-type layer. The tunneling structure is a stack structure including a first material layer, a second material layer and a third material layer. The N-type layer is formed on the tunneling structure. By adjusting a bias voltage that is applied to the P-type layer and the N-type layer, the tunneling structure is controlled to have a low resistance or a high resistance.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1A (prior art) schematically illustrates a memory cell of a conventional 3D phase change memory;

FIG. 1B (prior art) is a schematic perspective view of the conventional 3D phase change memory;

FIG. 1C (prior art) is a schematic circuit diagram illustrating an equivalent circuit of the conventional 3D phase change memory;

DETAILED DESCRIPTION OF PREFERRED EMBODIMENTS

Figure 2:
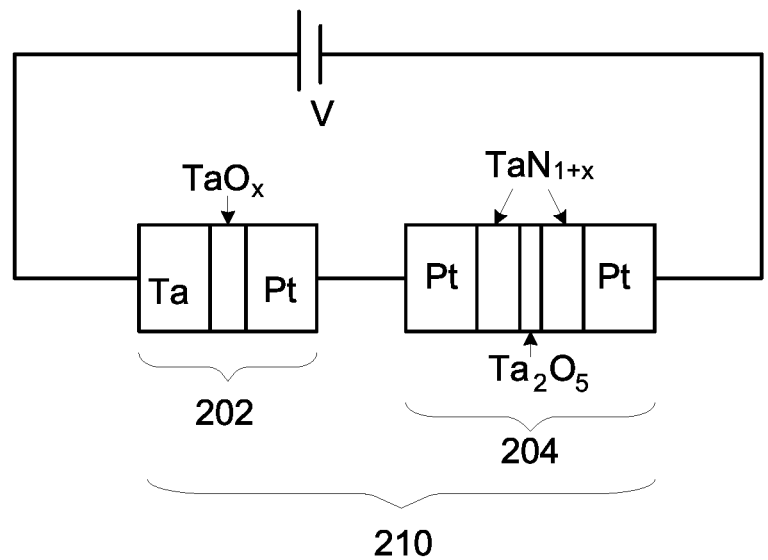
FIG. 2 (prior art) is a schematic circuit diagram of a memory cell of the phase change memory.
Figure 3:
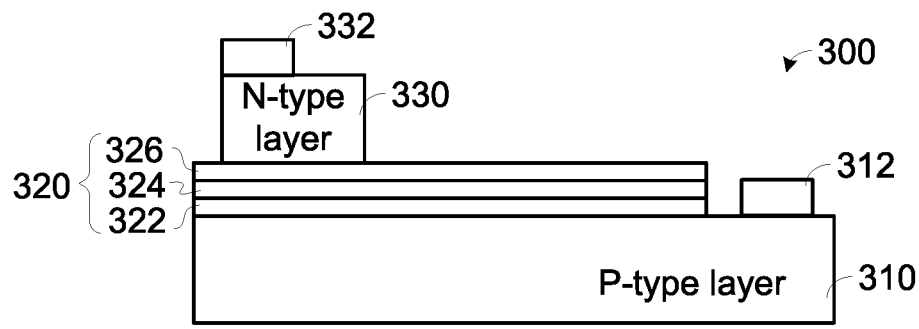
FIG. 3 is a schematic cross-sectional view illustrating memory cell of a phase change memory according to an embodiment of the present invention.

FIG. 3 is a schematic cross-sectional view illustrating memory cell of a phase change memory according to an embodiment of the present invention. As shown in FIG. 3, the memory cell 300 comprises a P-type layer 310, a tunneling structure 320 and an N-type layer 330. The memory cell 300 further comprises electrode layers 312 and 332. The electrode layer 312 and the P-type layer 310 are in ohmic contact with each other. Similarly, the electrode layer 332 and the N-type layer 330 are in ohmic contact with each other.

In an embodiment, the P-type layer 310 is a P-type silicon layer (P—Si), and the N-type layer 330 is an N-type indium tin oxide layer (N-ITO). While the memory cell 300 is forwardly biased, the voltage applied to the P-type layer 310 is higher than the voltage applied to the N-type layer 330. While the memory cell 300 is reversely biased, the voltage applied to the P-type layer 310 is lower than the voltage applied to the N-type layer 330. In other words, the bias voltage Vpn between the P-type layer 310 and the N-type layer 330 during the forward bias is higher than 0V, and the bias voltage Vpn between the P-type layer 310 and the N-type layer 330 during the reverse bias is lower than 0V.

Moreover, the tunneling structure 320 is a stack structure comprising plural phase change material layers. For example, the tunneling structure 320 is a stack structure comprising a first material layer 322, a second material layer 324 and a third material layer 326. The first material layer 322, the second material layer 324 and the third material layer 326 are a hafnium dioxide ($HfO_2$) layer, a zinc oxide (ZnO) layer and a hafnium dioxide ($HfO_2$) layer, respectively. Alternatively, the first material layer 322, the second material layer 324 and the third material layer 326 are a hafnium dioxide ($HfO_2$) layer, a zinc oxide (ZnO) layer and an aluminum oxide ($Al_2O_3$) layer, respectively. Alternatively, the first material layer 322, the second material layer 324 and the third material layer 326 are a hafnium dioxide ($HfO_2$) layer, a zinc oxide (ZnO) layer and a gallium oxide ($Ga_2O_3$) layer, respectively. In the tunneling structure 320, the second material layer 324 is a quantum well layer, and the first material layer 322 and the third material layer 326 are barrier layers.

Figure 4:
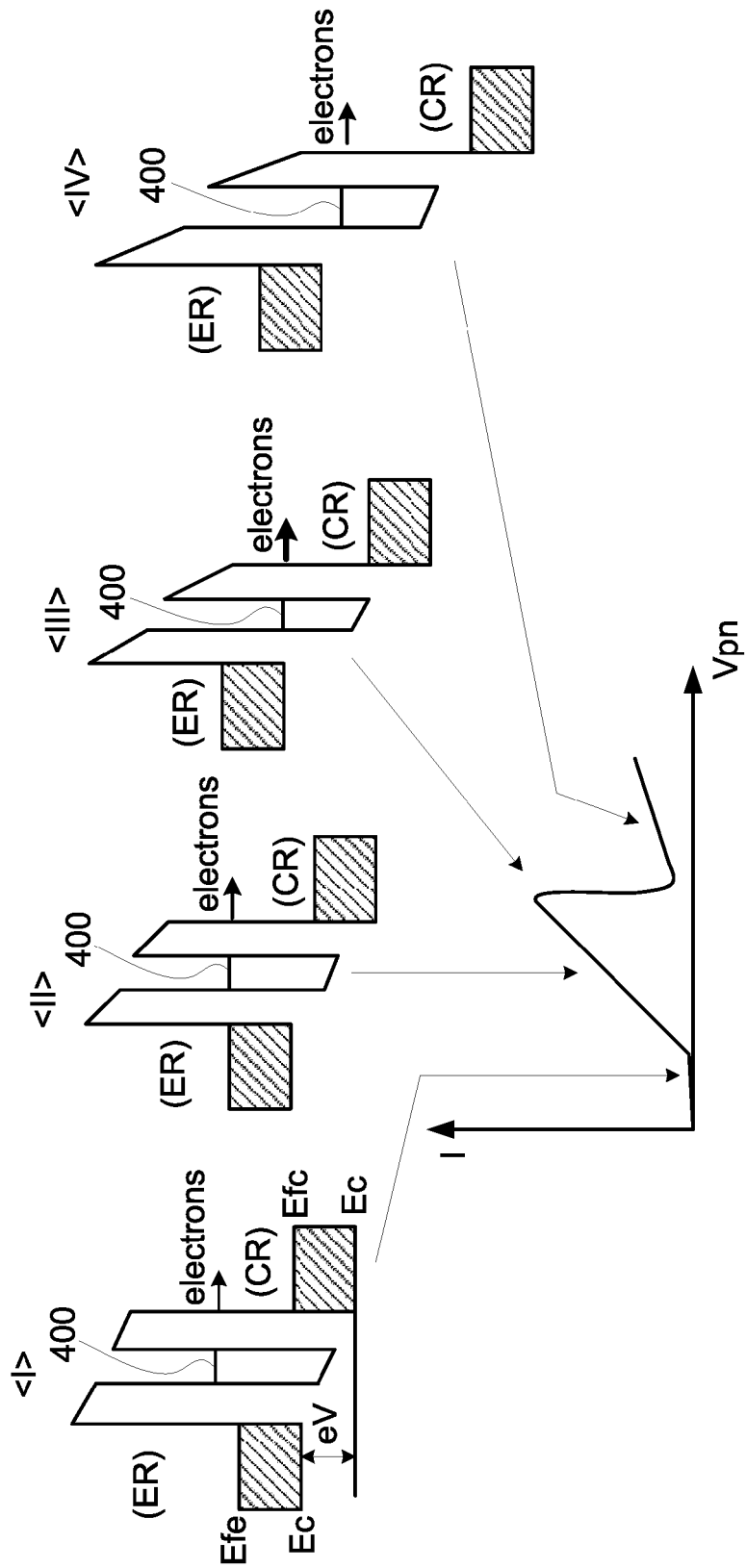
FIG. 4 schematically illustrates the relationship between the voltage and the current of the memory cell of the present invention during the forward bias and the corresponding energy band structures in different stages.

FIG. 4 schematically illustrates the relationship between the voltage and the current of the memory cell of the present invention during the forward bias and the corresponding energy band structures in different stages. As mentioned above, the tunneling structure 320 of the memory cell 300 comprises two barrier layers and a quantum well layer between the two barrier layers. The quantum well layer has a quantum-confined state 400. Moreover, an emitter region (ER) and a collector region (CR) are on two opposed sides of the barrier layers. In this embodiment, the emitter region (ER) is the N-type layer 330, and the collector region (CR) is the P-type layer 310.

Please refer to the energy band structure <I>. While the two terminals of the memory cell 300 are forwardly biased, there is an energy difference eV between the conduction bands (EC) of the emitter region (ER) and the collector region (CR). If the bias voltage Vpn is very low, the Fermi level (Efe) of the emitter region (ER) is lower than the quantum-confined state 400. Under this circumstance, the leakage current or the thermionic emission is over the tunnel barriers. Consequently, a small amount of electrons are injected into the collector region (CR).

Please refer to the energy band structure <II>. As the bias voltage Vpn applied to the two terminals of the memory cell 300 is gradually increased and the Fermi level (Efe) of the emitter region (ER) reaches the quantum-confined state 400, electrons start to be penetrated through the barrier layers and injected into the collector region (CR). Meanwhile, as the bias voltage Vpn is gradually increased, the forward current I is gradually increased.

Please refer to the energy band structure <III>. As the bias voltage Vpn applied to the two terminals of the memory cell 300 is gradually increased and the conduction bands (EC) of the emitter region (ER) reaches the quantum-confined state 400, the greatest amount of electrons are penetrated through the barrier layers and injected into the collector region (CR). Meanwhile, the forward current I has the peak value.

Please refer to the energy band structure <IV>. As the bias voltage Vpn applied to the two terminals of the memory cell 300 is gradually increased and the quantum-confined state 400 is lower than the conduction bands (EC) of the emitter region (ER), the electrons cannot be penetrated through the barrier layers to the collector region (CR). Meanwhile, the forward current I is decreased abruptly.

Figure 5A:
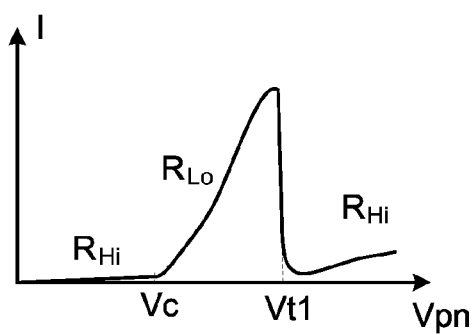
FIG. 5A schematically illustrates the change of the state of the tunneling structure in response to the forward bias voltage.

After the memory cell 300 is fabricated, the tunneling structure 320 is in the amorphous state. In response to the forward bias voltage, the state of the tunneling structure 320 of the memory cell 300 is changeable. FIG. 5A schematically illustrates the change of the state of the tunneling structure in response to the forward bias voltage.

After the memory cell 300 is fabricated, the tunneling structure 320 is in the amorphous state. As the bias voltage Vpn applied to the two terminals of the memory cell 300 is gradually increased during the forward bias and the bias voltage Vpn is lower than a cut-in voltage Vc, the forward current I of the memory cell 300 is very low or nearly zero. The memory cell 300 is said to exhibit the rectifying characteristics of a diode. Meanwhile, the tunneling structure 320 is maintained in the amorphous state, and the tunneling structure 320 has high resistance ($R_{Hi}$).

As the bias voltage Vpn applied to the two terminals of the memory cell 300 is continuously increased during the forward bias and the bias voltage Vpn is higher than the cut-in voltage Vc, the forward current I is gradually increased. Due to the joule effect of the large forward current I, the tunneling structure 320 of the memory cell 300 is heated. Consequently, such Joule heating effect enables the tunneling structure 320 to be subject to a phase change process. As a result, the tunneling structure 320 becomes crystalline state. If the bias voltage Vpn is provided to the memory cell 300 before the bias voltage Vpn reaches a first threshold voltage Vt1, the tunneling structure 320 remains in the crystalline state with the low resistance ($R_{Lo}$).

As the bias voltage Vpn applied to the two terminals of the memory cell 300 is continuously increased during the forward bias and the bias voltage Vpn is higher than the first threshold voltage Vt1, the obvious mismatch between the quantum-confined state and the Fermi level of the tunneling structure 320 results in the abrupt decrease of the peak current. Since the current flowing through the tunneling structure 320 is abruptly quenched, such fast removal of heating energy causes the tunneling structure 320 to be in the amorphous state with the high resistance ($R_{Hi}$).

That is, if the bias voltage Vpn applied to the two terminals of the memory cell 300 is higher than the cut-in voltage Vc and lower than the first threshold voltage Vt1 during the forward bias, the tunneling structure 320 is controlled to be in the crystalline state. Moreover, if the bias voltage Vpn applied to the two terminals of the memory cell 300 is higher than the first threshold voltage Vt1 during the forward bias, the tunneling structure 320 is controlled to be in the amorphous state.

As mentioned above, the tunneling structure 320 has the low resistance ($R_{Lo}$) in the crystalline state, and the tunneling structure 320 has the high resistance ($R_{Hi}$) in the amorphous state.

Figure 5B:
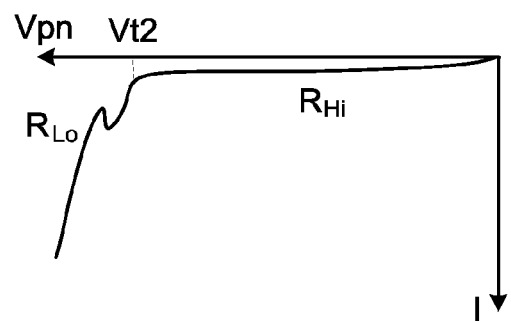
FIG. 5B schematically illustrates the change of the state of the tunneling structure in response to the reverse bias voltage.

Similarly, in response to the reverse bias voltage, the state of the tunneling structure 320 of the memory cell 300 is changeable. FIG. 5B schematically illustrates the change of the state of the tunneling structure in response to the reverse bias voltage.

After the memory cell 300 is fabricated, the tunneling structure 320 is in the amorphous state. In response to the reverse bias voltage, the reverse current I is very low. If the bias voltage Vpn applied to the two terminals of the memory cell 300, with magnitude |Vpn| lower than the magnitude of the second threshold voltage |Vt2| during the reverse bias, the tunneling structure 320 is maintained in the amorphous state, and the tunneling structure 320 has high resistance ($R_{Hi}$). Also, the memory cell 300 is said to exhibit the rectifying characteristics of a diode.

If the bias voltage Vpn applied to the two terminals of the memory cell 300, with magnitude |Vpn| increased to be higher than the magnitude of the second threshold voltage |Vt2| during the reverse bias, a large reverse tunneling current I is generated. Due to the joule effect of the large reverse tunneling current I, the tunneling structure 320 of the memory cell 300 is heated. Consequently, the tunneling structure 320 is subjected to a phase change process. Under this circumstance, the state of the tunneling structure 320 is changed from the amorphous state to the crystalline state, and thus the tunneling structure 320 has the low resistance ($R_{Lo}$).

That is, if the bias voltage Vpn applied to the two terminals of the memory cell 300, with magnitude |Vpn| increased to be higher than the magnitude of the second threshold voltage |Vt2| during the reverse bias, the tunneling structure 320 is controlled to be in the crystalline state.

From the above descriptions of FIGS. 5A and 5B, the memory cell 300 of the present invention has the function of a diode (i.e., the function of the selector). Moreover, the tunneling structure 320 of the memory cell 300 has the function of a storage element. In other words, the memory cell of the present invention is a single electronic component with the functions of the storage element and the selector. Hereinafter, some memory cells with different material layers and the characteristics thereof will be described.

FIGS. 6A~6D schematically illustrate the energy band structures of the memory cell according to a first embodiment of the present invention. In this embodiment, the memory cell comprises an N-type indium tin oxide layer (N-ITO), a hafnium dioxide ($HfO_2$) layer, a zinc oxide (ZnO) layer, an aluminum oxide ($Al_2O_3$) layer, and a P-type silicon layer (P—Si) sequentially. The thicknesses of the N-type indium tin oxide layer (N-ITO), the hafnium dioxide ($HfO_2$) layer, the zinc oxide (ZnO) layer and the aluminum oxide ($Al_2O_3$) layer are 240 nm, 4 nm, 3 nm and 5 nm, respectively.

Figure 6A:
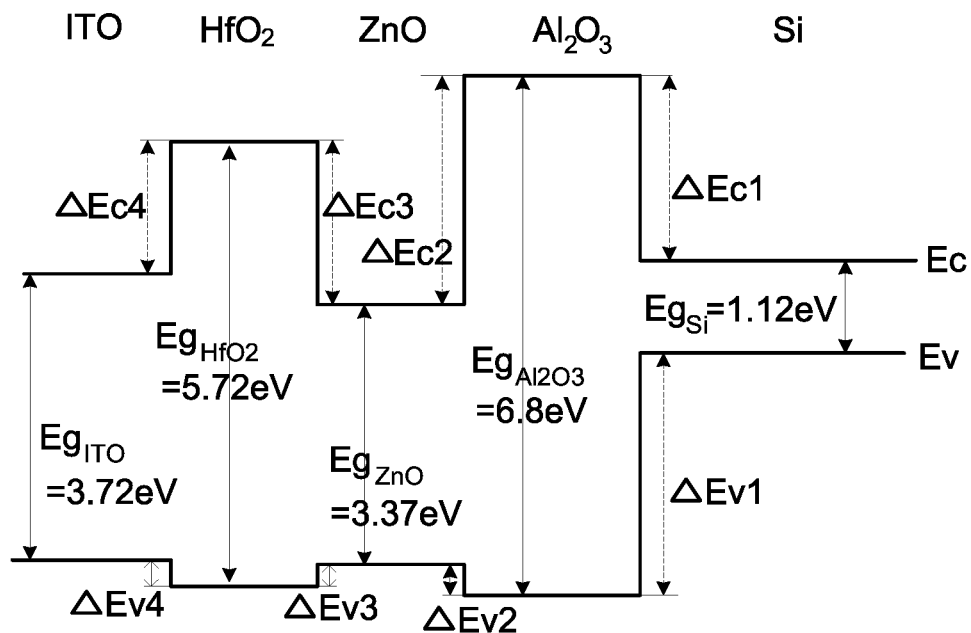
FIGS. 6A-6D schematically illustrate the energy band structures of the memory cell according to a first embodiment of the present invention.

FIG. 6A schematically illustrates the energy band structure of the memory cell 300 before the above layers are contacted with each other. The energy gap $Eg_{si}$ of the P-type silicon layer (P—Si) is 1.12 eV. The energy gap $Eg_{Al2O3}$ of the aluminum oxide ($Al_2O_3$) layer is 6.8 eV. The energy gap $Eg_{ZnO}$ of the zinc oxide (ZnO) layer is 3.37 eV. The energy gap $Eg_{HfO2}$ of the hafnium dioxide ($HfO_2$) layer is 5.72 eV. The energy gap $Eg_{ITO}$ of the N-type indium tin oxide layer (N-ITO) is 3.72 eV.

The conduction band difference $\Delta Ec1(Al_2O_3$—Si) between the P-type silicon layer (P—Si) and the aluminum oxide ($Al_2O_3$) layer is 2.44 eV. The conduction band difference $\Delta Ec2(ZnO$—$Al_2O_3$) between the aluminum oxide ($Al_2O_3$) layer and the zinc oxide (ZnO) layer is 3 eV. The conduction band difference $\Delta Ec3(HfO2$-ZnO) between the zinc oxide (ZnO) layer and the hafnium dioxide (HfO$_2$) layer is 2.11 eV. The conduction band difference ΔEc4(ITO-HfO$_2$) between the hafnium dioxide (HfO$_2$) layer and the N-type indium tin oxide layer (N-ITO) is 1.72 eV.

The valence band difference ΔEv1(Al$_2$O$_3$—Si) between the P-type silicon layer (P—Si) and the aluminum oxide (Al$_2$O$_3$) layer is 3.24 eV. The valence band difference ΔEv2(ZnO—Al$_2$O$_3$) between the aluminum oxide (Al$_2$O$_3$) layer and the zinc oxide (ZnO) layer is 0.43 eV. The valence band difference ΔEv3(HfO$_2$—ZnO) between the zinc oxide (ZnO) layer and the hafnium dioxide (HfO$_2$) layer is 0.24 eV. The valence band difference ΔEv4(ITO-HfO$_2$) between the hafnium dioxide (HfO$_2$) layer and the N-type indium tin oxide layer (N-ITO) is 0.28 eV.

Figure 6B:
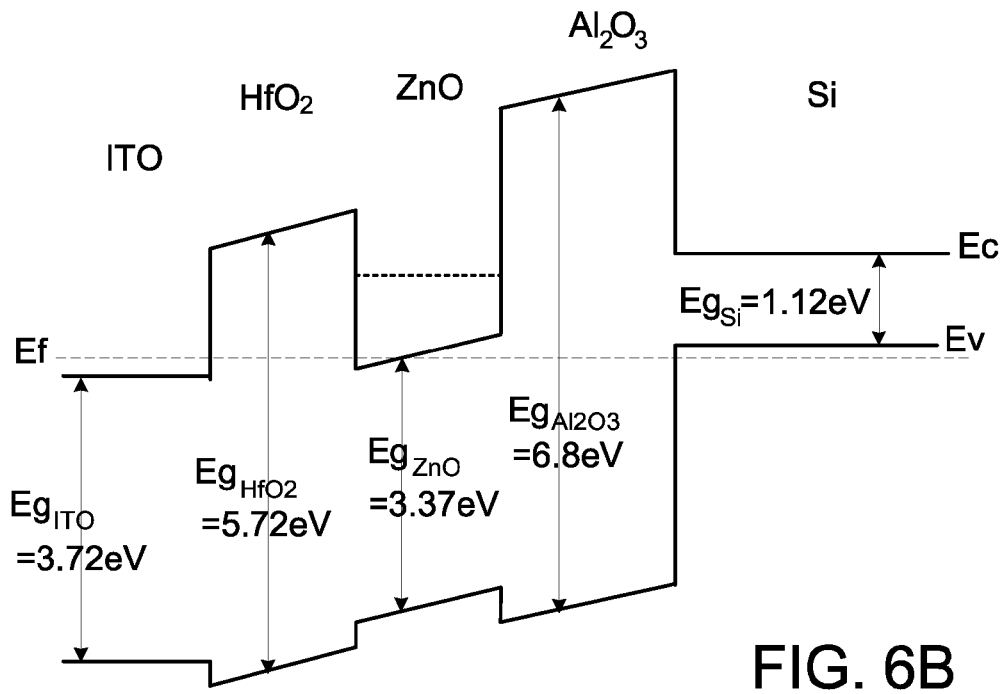

FIG. 6B schematically illustrates the energy band structure of the memory cell 300 in equilibrium when the above layers are contacted with each other. When the above layers of the memory cells are contacted with each other, the Fermi level (Efe) is in alignment. Meanwhile, the quantum-confined state is higher than the Fermi level (Efe) of the N-type indium tin oxide layer (N-ITO). The potential well of the zinc oxide (ZnO) layer can avoid generation of the low field tunneling effect.

Figure 6C:
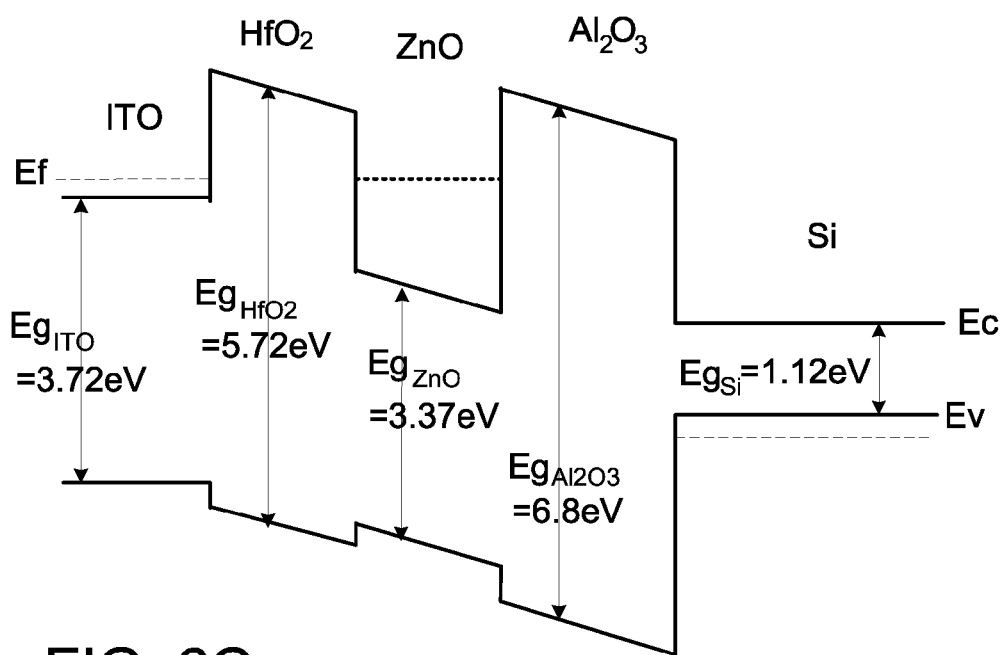

FIG. 6C schematically illustrates the energy band structure of the memory cell 300 during the forward bias. As the bias voltage Vpn applied to the memory cell 300 is continuously increased during the forward bias and the bias voltage Vpn reaches the Fermi level (Efe) of the N-type indium tin oxide layer (N-ITO), electrons are penetrated through the barrier layers. Moreover, as the forward bias voltage is increased, the forward current is correspondingly increased. Moreover, the hole flow from the valence band of the P-type silicon layer (P—Si) is blocked out.

Figure 6D:
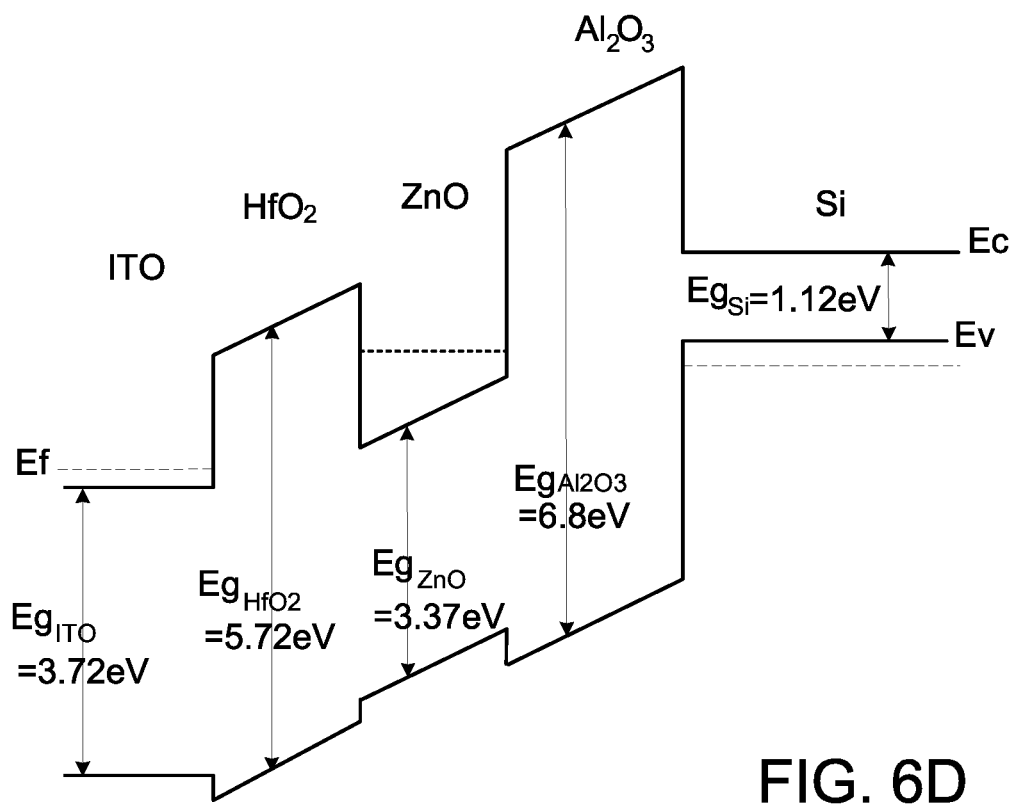

FIG. 6D schematically illustrates the energy band structure of the memory cell 300 during the reverse bias. When the magnitude of reverse bias voltage is low and applied to the memory cell 300, both of the electron flow and the hole flow are blocked out. With increase of the magnitude in the reversed bias voltage Vpn, valence band electrons are penetrated from the P-type silicon layer (P—Si) to the N-type indium tin oxide layer (N-ITO) through the aluminum oxide (Al$_2$O$_3$) layer, the zinc oxide (ZnO) layer and the hafnium dioxide (HfO$_2$) layer.

Figure 7A:
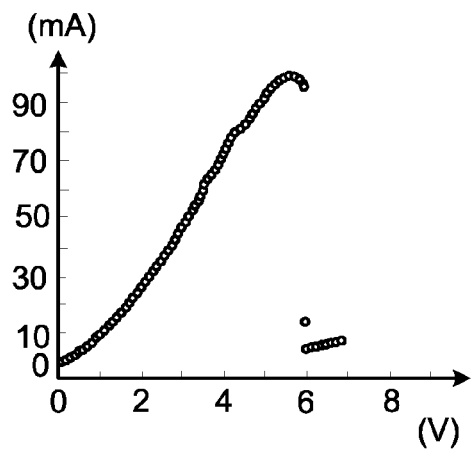
FIG. 7A schematically illustrates the relationship between the bias voltage and the forward current of the memory cell according to the first embodiment of the present invention.
Figure 7B:
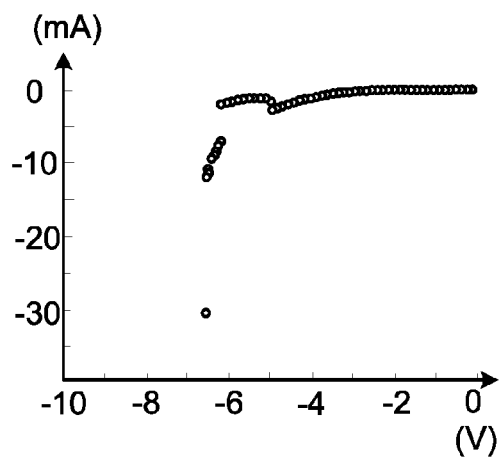
FIG. 7B schematically illustrates the relationship between the bias voltage and the reverse current of the memory cell according to the first embodiment of the present invention.

FIG. 7A and FIG. 7B illustrate the I-V characteristics of the embodiment, the memory cell comprises an N-type indium tin oxide layer (N-ITO), a hafnium dioxide (HfO$_2$) layer, a zinc oxide (ZnO) layer, an aluminum oxide (Al$_2$O$_3$) layer, and a P-type silicon layer (P—Si) sequentially. The thicknesses of the N-type indium tin oxide layer (N-ITO), the hafnium dioxide (HfO$_2$) layer, the zinc oxide (ZnO) layer and the aluminum oxide (Al$_2$O$_3$) layer are 240 nm, 4 nm, 3 nm and 5 nm, respectively.

FIG. 7A schematically illustrates the relationship between the bias voltage and the forward current of the memory cell according to the first embodiment of the present invention. FIG. 7B schematically illustrates the relationship between the bias voltage and the reverse current of the memory cell according to the first embodiment of the present invention. The selective memory writing/rewriting (setting/resetting) operation procedure of device 300 is shown in FIG. 7A and FIG. 7B. In this embodiment, the device is first to operate in the reverse bias polarity (FIG. 7B) to set the device from amorphous state of high resistance to crystalline state of low resistance. Then the device is operated in the forward bias polarity (FIG. 7A) to reset the device from crystalline state of low resistance to amorphous state of high resistance. More specifically, As shown in FIG. 7B of the reverse bias voltage with magnitude lower than the magnitude of the second threshold voltage |Vt2|, the device remains in the amorphous state. When the magnitude of the reverse bias voltage increased above than about |−6V|, consequently, the memory cell is changed from the amorphous state to the crystalline state. It follows that as shown in FIG. 7A of the forward bias condition, the current increases with bias voltage when the tunneling device is in a crystalline state. Continuous increase of the forward bias voltage higher than the first threshold voltage Vt1, about +6V, consequently causes rapid quench of the tunneling current. The device is then changed from the crystalline state to the amorphous state.

Figure 8A:
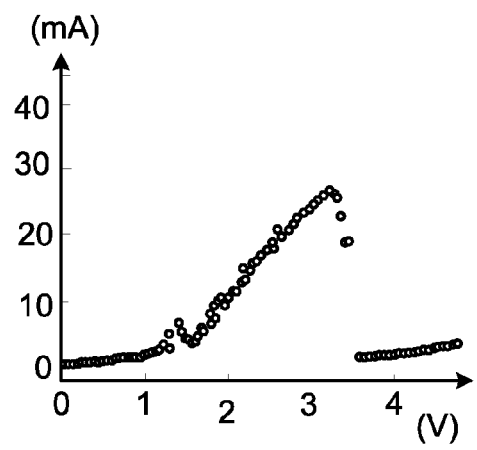
FIG. 8A schematically illustrates the relationship between the bias voltage and the forward current of the memory cell according to a second embodiment of the present invention.
Figure 8B:
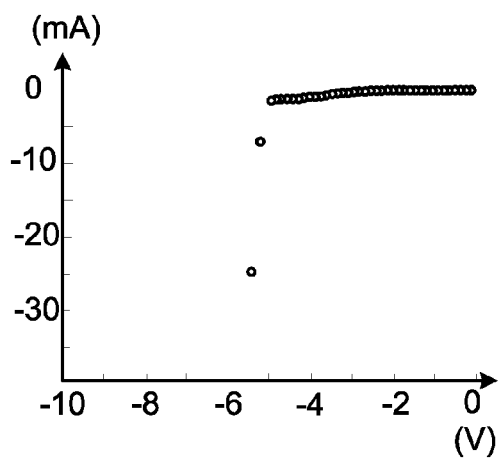
FIG. 8B schematically illustrates the relationship between the bias voltage and the reverse current of the memory cell according to the second embodiment of the present invention.

FIG. 8A schematically illustrates the relationship between the bias voltage and the forward current of the memory cell according to a second embodiment of the present invention. FIG. 8B schematically illustrates the relationship between the bias voltage and the reverse current of the memory cell according to the second embodiment of the present invention. In this embodiment, the memory cell comprises an N-type indium tin oxide layer (N-ITO), a hafnium dioxide (HfO$_2$) layer, a zinc oxide (ZnO) layer, another hafnium dioxide (HfO$_2$) layer, and a P-type silicon layer (P—Si) sequentially. The thicknesses of the N-type indium tin oxide layer (N-ITO), the hafnium dioxide (HfO$_2$) layer, the zinc oxide (ZnO) layer and the hafnium dioxide (HfO$_2$) layer are 240 nm, 2 nm, 6 nm and 2 nm, respectively.

As shown in FIG. 8A, the bias voltage in the forward bias polarity is higher than the first threshold voltage Vt1 when the bias voltage is higher than about +3.2V. Consequently, the tunneling structure of the memory cell is changed from the crystalline state to the amorphous state. As shown in FIG. 8B, the bias voltage in the reverse bias polarity is lower than the second threshold voltage Vt2 when the bias voltage is lower than about −5V. Consequently, the tunneling structure of the memory cell is changed from the amorphous state to the crystalline state.

Figure 9A:
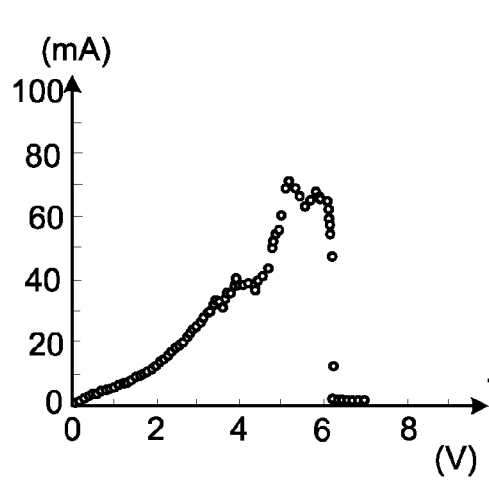
FIG. 9A schematically illustrates the relationship between the bias voltage and the forward current of the memory cell according to a third embodiment of the present invention.
Figure 9B:
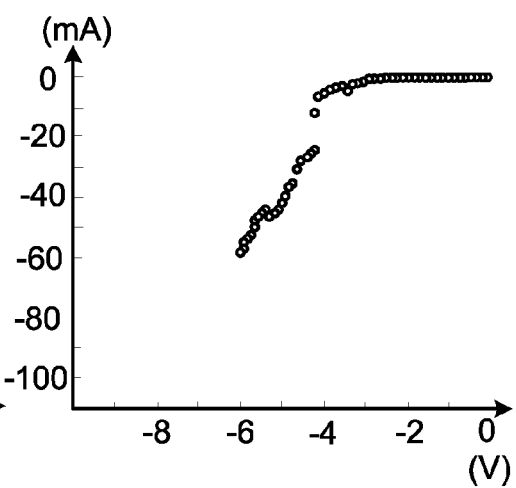
FIG. 9B schematically illustrates the relationship between the bias voltage and the reverse current of the memory cell according to the third embodiment of the present invention.

FIG. 9A schematically illustrates the relationship between the bias voltage and the forward current of the memory cell according to a third embodiment of the present invention. FIG. 9B schematically illustrates the relationship between the bias voltage and the reverse current of the memory cell according to the third embodiment of the present invention. In this embodiment, the memory cell comprises an N-type indium tin oxide layer (N-ITO), a hafnium dioxide (HfO$_2$) layer, a zinc oxide (ZnO) layer, a gallium oxide (Ga$_2$O$_3$) layer, and a P-type silicon layer (P—Si) sequentially. The thicknesses of the N-type indium tin oxide layer (N-ITO), the hafnium dioxide (HfO$_2$) layer, the zinc oxide (ZnO) layer and the gallium oxide (Ga$_2$O$_3$) layer are 240 nm, 4 nm, 4 nm and 4 nm, respectively.

As shown in FIG. 9A, the bias voltage in a forward bias polarity is higher than the first threshold voltage Vt1 when the bias voltage is higher than about +6V. Consequently, the tunneling structure of the memory cell is changed from the crystalline state to the amorphous state. As shown in FIG. 9A, the bias voltage in a reverse bias polarity is lower than the second threshold voltage Vt2 when the bias voltage is lower than about −4V. Consequently, the tunneling structure of the memory cell is changed from the amorphous state to the crystalline state.

According to the characteristics of the memory cell of the present invention, the memory cell is turned on (into a low resistance state) when the reverse bias voltage lower than the second threshold voltage Vt2, and the memory cell is turned off (into a high resistance state) when the forward bias voltage is higher than the first threshold voltage Vt1. Furthermore, when the memory cell is forwardly biased and the bias voltage is lower than the first threshold voltage Vt1, the memory cell is turned on, and when the memory cell is reversely biased and the bias voltage is higher than a second threshold voltage, the memory cell is turned off.

From the above descriptions, the present invention provides a novel memory cell of a phase change memory. The memory cell is a single electronic component with the functions of a storage element and a selector. By properly adjusting the bias voltage, the tunneling structure of the memory cell is controlled to be in the amorphous state or the crystalline state. When the forward bias voltage is higher than a first threshold voltage, the tunneling structure of the memory cell is changed from the crystalline state to the amorphous state. When the bias voltage is lower than a second threshold voltage, the tunneling structure of the memory cell is changed from the amorphous state to the crystalline state.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A memory cell of a phase change memory, the memory cell comprising:
   a P-type layer;
   a tunneling structure formed on the P-type layer, wherein the tunneling structure is a stack structure comprising a first material layer, a second material layer and a third material layer; and
   an N-type layer formed on the tunneling structure,
   wherein by adjusting a bias voltage that is applied to the P-type layer and the N-type layer, the tunneling structure is controlled to be in the amorphous state or the crystalline state, and when the memory cell is reversely biased and the bias voltage is lower than a first threshold voltage, the tunneling structure is changed to the crystalline state.

2. The memory cell as claimed in claim 1, further comprising a first electrode layer and a second electrode layer, wherein the first electrode layer is in contact with the P-type layer, and the second electrode layer is in contact with the N-type layer.

3. The memory cell as claimed in claim 1, wherein the P-type layer is a P-type silicon layer, and the N-type layer is an N-type indium tin oxide layer.

4. The memory cell as claimed in claim 1, wherein the first material layer, the second material layer and the third material layer are respectively a hafnium dioxide layer, a zinc oxide layer and another hafnium dioxide layer, or the first material layer, the second material layer and the third material layer are respectively an aluminum oxide layer, a zinc oxide layer and a hafnium dioxide layer, or the first material layer, the second material layer and the third material layer are respectively a gallium oxide layer, a zinc oxide layer and a hafnium dioxide layer.

5. The memory cell as claimed in claim 1, wherein when the memory cell is forwardly biased and the bias voltage is higher than a second threshold voltage, the tunneling structure is changed to the amorphous state.

6. The memory cell as claimed in claim 1, wherein when the memory cell is forwardly biased and the bias voltage is lower than a first threshold voltage, the memory cell is turned on, wherein when the memory cell is reversely biased and the bias voltage is higher than a second threshold voltage, the memory cell is turned off.

7. A memory cell of a phase change memory, the memory cell comprising:
   a P-type layer;
   a tunneling structure formed on the P-type layer, wherein the tunneling structure is a stack structure comprising a first material layer, a second material layer and a third material layer; and
   an N-type layer formed on the tunneling structure,
   wherein by adjusting a bias voltage that is applied to the P-type layer and the N-type layer, the tunneling structure is controlled to have a low resistance or a high resistance, and when the memory cell is reversely biased and the bias voltage is lower than a first threshold voltage, the tunneling structure is changed to have the low resistance.

8. The memory cell as claimed in claim 7, further comprising a first electrode layer and a second electrode layer, wherein the first electrode layer is in contact with the P-type layer, and the second electrode layer is in contact with the N-type layer.

9. The memory cell as claimed in claim 7, wherein the P-type layer is a P-type silicon layer, and the N-type layer is an N-type indium tin oxide layer.

10. The memory cell as claimed in claim 7, wherein the first material layer, the second material layer and the third material layer are respectively a hafnium dioxide layer, a zinc oxide layer and another hafnium dioxide layer, or the first material layer, the second material layer and the third material layer are respectively an aluminum oxide layer, a zinc oxide layer and a hafnium dioxide layer, or the first material layer, the second material layer and the third material layer are respectively a gallium oxide layer, a zinc oxide layer and a hafnium dioxide layer.

11. The memory cell as claimed in claim 7, wherein when the memory cell is forwardly biased and the bias voltage is higher than a second threshold voltage, the tunneling structure is changed to have the high resistance.

12. The memory cell as claimed in claim 7, wherein when the memory cell is forwardly biased and the bias voltage is lower than a first threshold voltage, the memory cell is turned on, wherein when the memory cell is reversely biased and the bias voltage is higher than a second threshold voltage, the memory cell is turned off.

* * * * *